(12) United States Patent
Norin et al.

(10) Patent No.: US 8,185,723 B2
(45) Date of Patent: May 22, 2012

(54) METHOD AND APPARATUS TO EXTRACT INTEGER AND FRACTIONAL COMPONENTS FROM FLOATING-POINT DATA

(75) Inventors: Robert S. Norin, Tigard, OR (US); Olga Dryzhakova, Dzerjinsk (RU); Alexander Isaev, Nizhny Novgorod (RU); Andrey Naraikin, Nizhny Novgorod (RU)

(73) Assignee: Intel Corporation, Santa Clara, CA (US)

( * ) Notice: Subject to any disclaimer, the term of this patent is extended or adjusted under 35 U.S.C. 154(b) by 1807 days.

(21) Appl. No.: 10/483,279

(22) PCT Filed: Jul. 13, 2001

(86) PCT No.: PCT/RU01/00286
§ 371 (c)(1),
(2), (4) Date: Jan. 16, 2007

(87) PCT Pub. No.: WO03/007147
PCT Pub. Date: Jan. 23, 2003

(65) Prior Publication Data
US 2011/0119471 A1     May 19, 2011

(51) Int. Cl.
*G06F 7/38* (2006.01)
(52) U.S. Cl. .................................................. 712/221
(58) Field of Classification Search ............... None
See application file for complete search history.

(56) References Cited

U.S. PATENT DOCUMENTS

| | | | | |
|---|---|---|---|---|
| 4,208,722 A | * | 6/1980 | Rasala et al. | 708/628 |
| 5,257,215 A | * | 10/1993 | Poon | 708/204 |
| 5,317,526 A | * | 5/1994 | Urano et al. | 708/204 |
| 5,561,615 A | * | 10/1996 | Kuo et al. | 708/204 |
| 5,768,169 A | * | 6/1998 | Sharangpani | 708/495 |
| 5,940,311 A | | 8/1999 | Dao et al. | |
| 6,038,582 A | | 3/2000 | Arakawa et al. | |
| 6,205,460 B1 | | 3/2001 | Steele, Jr. | |
| 6,405,306 B2 | * | 6/2002 | Elliott et al. | 712/222 |
| 6,415,308 B1 | * | 7/2002 | Dhablania | 708/204 |
| 6,502,115 B2 | * | 12/2002 | Abdallah et al. | 708/204 |
| 6,684,232 B1 | * | 1/2004 | Handlogten et al. | 708/204 |

FOREIGN PATENT DOCUMENTS

| | | |
|---|---|---|
| RU | 2276805 | 5/2006 |
| SU | 1259248 A1 | 9/1986 |
| SU | 1361542 A1 | 12/1987 |
| SU | 1513443 A1 | 10/1989 |
| SU | 1546964 A1 | 2/1990 |

OTHER PUBLICATIONS

PCT/RU01/00286, International Search Report.
Naraikin, Andrel, et al., "A Method and Apparatus to Extract Integer and Fractional Components from Floating-Point Data ", Office Action from RU 2276805 mailed May 20, 2005, 7 pgs.

* cited by examiner

*Primary Examiner* — Eric Coleman
(74) *Attorney, Agent, or Firm* — Blakely, Sokoloff, Taylor & Zafman LLP

(57) ABSTRACT

A method is presented including decomposing a first value into many parts. Decomposing includes shifting (310) a rounded integer portion of the first value to generate a second value. Generating (320) a third value. Extracting (330) a plurality of significand bits from the second value to generate a fourth value. Extracting (340) a portion of bits from the fourth value to generate an integer component. Generating (350) a fifth value. Also the third value, the fifth value, and the integer component are either stored (360, 380) in a memory or transmitted to an arithmetic logical unit (ALU).

7 Claims, 8 Drawing Sheets

METHOD AND APPARATUS TO EXTRACT INTEGER AND FRACTIONAL COMPONENTS FROM FLOATING-POINT DATA

BACKGROUND OF THE INVENTION

1. Field of the Invention

This invention relates to processing computations, and more particularly to a method and apparatus for reducing floating-point operations necessary to extract integer and fractional components.

2. Description of the Related Art

In many processing systems today, such as personal computers (PCs), mathematical computations play an important role. Numerical algorithms for computation of many mathematical functions, such as exponential and trigonometric operations, require the decomposition of floating-point numbers into their associated integer and fractional parts. These operations may be used for argument reduction, indexes to table values, or for the construction of a result from a number of constituent elements. Many times, decompositions of floating point numbers into their integer and fractional parts occur in the critical computational path. As a result, the speed at which the mathematical functions may be executed are often times limited.

BRIEF DESCRIPTION OF THE DRAWINGS

The invention is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION OF THE INVENTION

The invention generally relates to a method to reduce the number of floating point operations necessary to extract integer and fractional components. Referring to the figures, exemplary embodiments of the invention will now be described. The exemplary embodiments are provided to illustrate the invention and should not be construed as limiting the scope of the invention.

Figure 1:
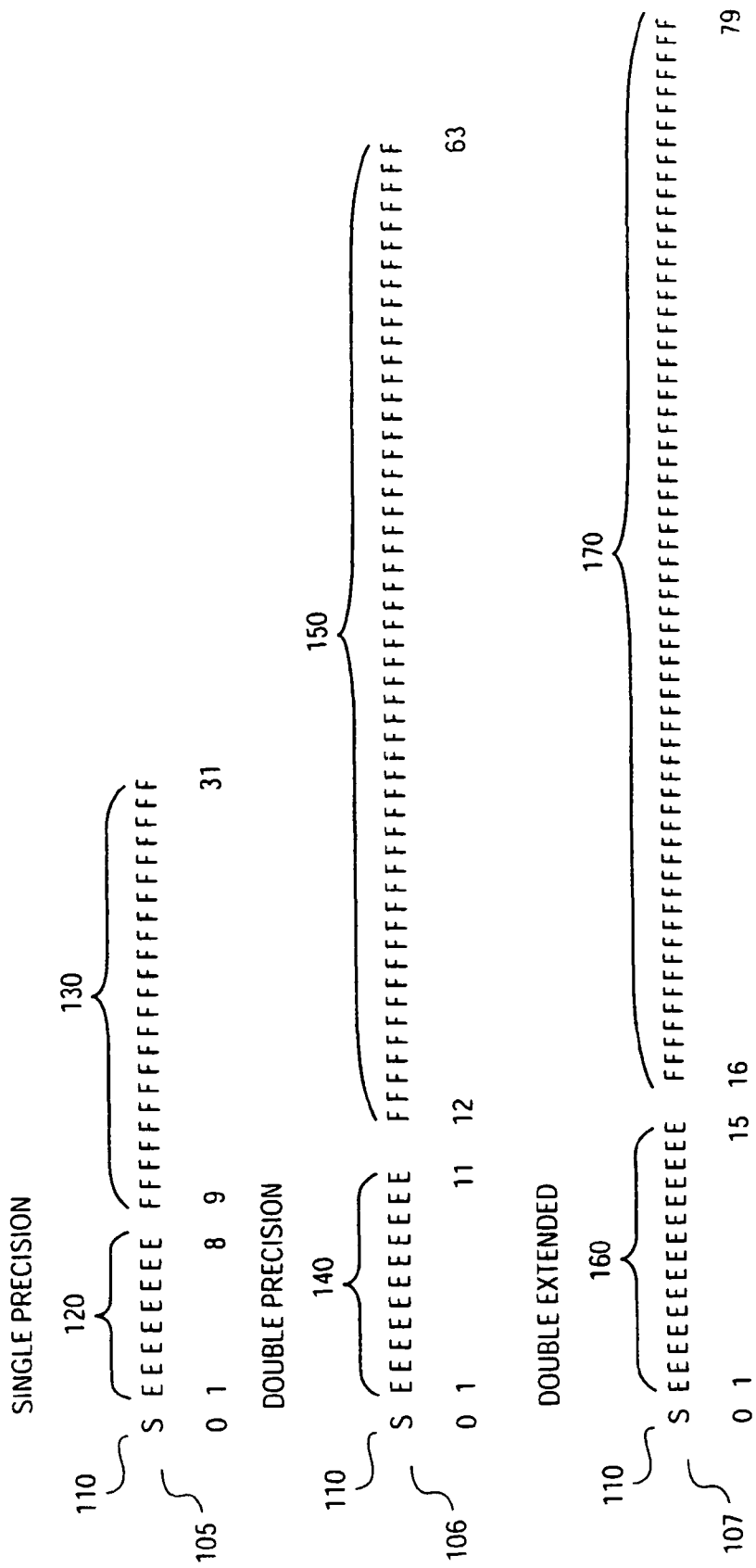
FIG. 1 illustrates the ANSI/IEEE standard 754-1985, IEEE standard for binary floating-point arithmetic, IEEE, New York 1985 (IEEE) representation for a single precision floating-point, double precision representation and double extended precision representation.

FIG. 1 illustrates the ANSI/IEEE standard 754-1985, IEEE standard for binary floating-point arithmetic, IEEE, New York 1985 (IEEE) representation for a single precision floating-point representation 105, double precision representation 106, and double extended representation 107. The IEEE single precision representation 105 requires a 32-bit word. This 32-bit word may be represented as bits numbered from left to right (0 to 31). The first bit, F 110, is a sign bit. The next eight bits, labeled E 120, are exponent bits. The final 23 bits, 9 through 31, represented as F 130, are the fractions (also known as the significand).

For IEEE double precision representation 106, F 110 is a sign bit, E 140 are the exponent bits (11 bits), and the final representative bits, F 150, are the 52 fraction representation bits (also known as the significand).

For IEEE double extended precision representation 107, F 110 is a sign bit, E 160 are the exponent bits (15 bits), and the final representative bits, F 170, are the 64 fraction representation bits (also known as the significand).

As an example of the decomposition of floating-point numbers into their integer and fractional parts, the following equations are presented to illustrate one such example:

Given $$w = x * A \qquad \text{(Equation 1)}$$

where $A = 1/B$          (Equation 2)

Find $n$ and $r$ where $x = n*B + r$          (Equation 3)

where n is a whole number, and A, B, r, w and x are floating-point quantities. Therefore, the problem may be restated as: given an input argument, x, and constants A and B, how many times n does the value B occur in the value x, and what is the remainder? Moreover, n is often used as an index to perform a table lookup, or as the exponent of a subsequent quantity such as $2^n$. Therefore, n needs to be represented both as an integer ($n_i$), and as a floating-point quantity ($n_f$). Thus, three quantities are needed from the computation: $n_i$ (n as an integer), $n_f$ (n as a floating-point value) and r as a floating-point value.

Figure 2:
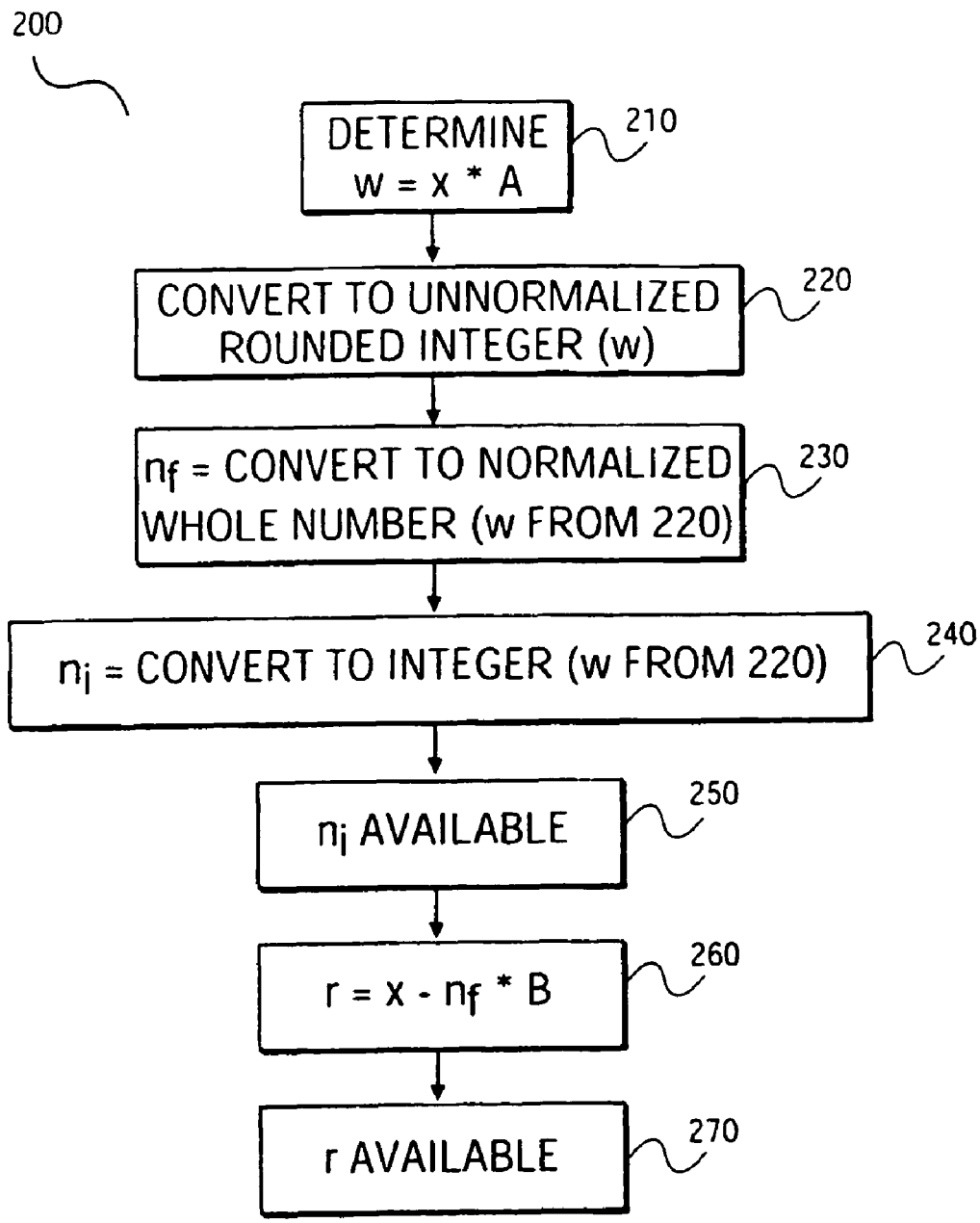
FIG. 2 illustrates a typical method for computing integer and floating point numbers for an equation.

FIG. 2 illustrates a typical method for computing $n_i$, $n_f$, and $r$. In FIG. 2, process 200 begins with block 210 where w=x*A. Block 220 converts w to an unnormalized rounded integer. The value computed in block 220 is then used in block 230 to compute $n_f$ by having this number normalized as a whole number. Block 240 also uses the value from block 220 and then computes $n_i$ by converting the value from block 220 to an integer. In block 250, $n_i$ is available to be transferred to an arithmetic logical unit (ALU) or stored in memory. In block 260, r is computed by subtracting the quantity of $n_f*B$ from x. In block 270, r is available to be transferred to an ALU or stored in memory.

Table I illustrates the typical method of computing $n_i$, $n_f$, and $r$ in terms of instruction level pseudo-code. As can be seen from Table I, there are three floating point operations handled by a floating-point arithmetic and logic unit (Falu), and one integer operation handled by an integer arithmetic and logical unit (Iglu). Note that the numbers in parentheses refer to cumulative instruction cycle count (latency) for a processor such as an Intel Itanium™ processor.

TABLE I

| | | |
|---|---|---|
| Falu op 1: | w = x * A | (1) |
| Falu op 2: | w_rshifted = convert_to_<br>unnormalized_rounded_int(w) | (6) |
| Falu op 3: | $n_f$ = convert_to_normalized_<br>whole_number(w_rshifted) | (13) |

TABLE I-continued

| Ialu op 1: | $n_i$ = convert_to_integer(w_rshifted) | (14) |
|---|---|---|
| | $n_i$ available | (18) |
| Falu op 4: | $r = x - n_f * B$ | (18) |
| | r available | (23) |

Figure 3:
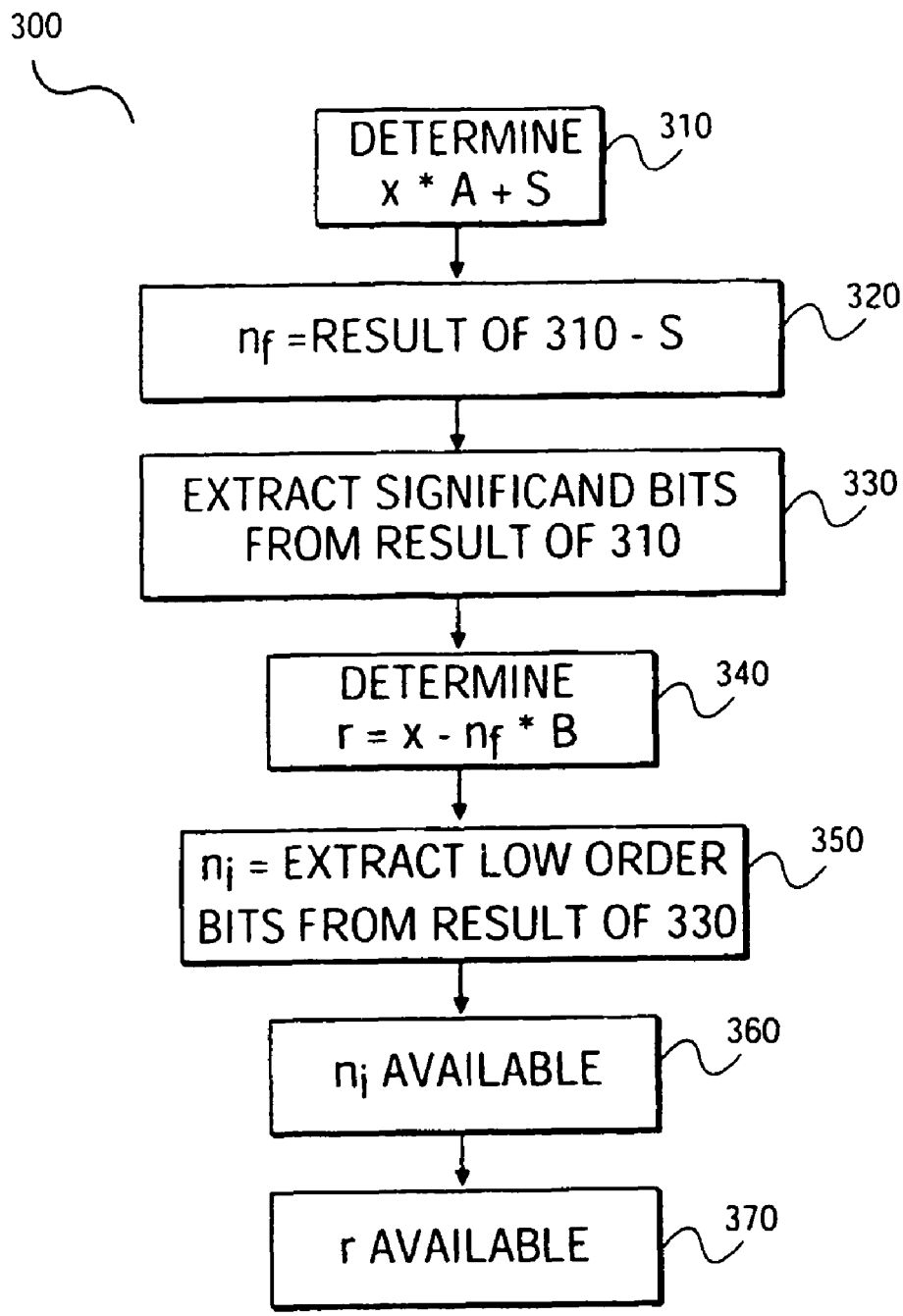
FIG. 3 illustrates an embodiment of the invention that reduces the number of floating point operations necessary to compute integer and fractional components.

FIG. 3 illustrates an embodiment of the invention that reduces the number of floating point operations necessary to compute $n_i$, $n_f$, and $r$. Process 300 begins with block 310 which computes $x*A+S$, where S and A are constants and x is a floating-point number. In one embodiment of the invention, the constant S is chosen such that the addition of S to $x*A$ will shift the rounded integer portion of $x*A$ into the rightmost bits of the significand. Block 320 then computes $n_f$ by subtracting S from the value computed in block 310, thus creating an integer value. Block 330 creates $n_i+S$ by extracting the significand bits from the resulting value from block 310. Block 340 computes r by subtracting the quantity of $n_f*B$ from x. Block 350 extracts low ordered bits from the value computed in block 330, resulting in $n_i$. In block 360, $n_i$ is available to be transmitted to an ALU or stored in memory. In block 370 r is available to be transmitted to an ALU or stored in memory.

Table II illustrates the embodiment of the invention reducing floating-point operations in instruction-level pseudo-code. Note that as an example, the numbers in parentheses refer to cumulative instruction cycle count (latency) for a processor such as an Intel Itanium™ processor. In one embodiment of the invention, the constant S is chosen such that the addition of S to $x*A$ will shift the rounded integer portion of $x*A$ into the rightmost bit of the significand. Therefore, S can be converted into the integer, $n_i$, after one Falu operation instead of two. Moreover, the floating-point representation, $n_f$, can be directly obtained by a second Falu operation that subtracts S from the first Falu result. It can be seen that the desired quantities are obtained with one less Falu instruction. Thus, the embodiment of the invention results in a savings of seven cycles of overall latency on a processor, such as an Intel Itanium™ processor.

TABLE II

| Falu op 1: | w_plus_S_rshifted = $x * A + S$ | (1) |
|---|---|---|
| Falu op 2: | $n_f$ = w_plus_S_rshifted − S | (6) |
| Ialu op 1: | ni_plus_S = extract_significand_bits(w_plus_S_rshifted) | (9) |
| Falu op 3: | $r = x - n_f * B$ | (11) |
| Ialu op 2: | $n_i$ = extract_low_order_bits(ni_plus_S) | (11) |
| | $n_i$ available | (12) |
| | r available | (16) |

A performance benefit also accrues to many software pipeline loops involving this embodiment of the invention. Many loops are resource limited by the number of floating-point instructions required by the computation. Since, this embodiment of the invention involves one less floating-point instruction than a typical method, maximum throughput for the loop is increased.

The following discussion relates to the selection of the constant S in one embodiment of the invention. For ease of discussion, suppose the floating-point representation contains b bits in the significand (e.g., b=64), an explicit integer bit, and b−1 bits of fraction. The exponent field of the floating-point representation locates the binary point within or beyond the significant digits. Therefore, the integer part of a normalized floating-point number can be obtained in the right-most bits of the significand by an unnormalizing operation, which shifts the significand b−1 bits to the right, rounds the significand, and adds b−1 to the exponent. The significand contains the integer as a b-bit, 2's complement integer. The low-order bits of the significand containing the integer part of original floating-point number can be obtained by adding to the number, a constant $1.10\ldots000*2^{b-1}$. This constant, is one value of S selected in one embodiment of the invention.

The resulting significand contains the integer as a (b−2) bit 2's complement integer. The bit immediately to the left of the b−2 zeros in the fractional part is used to ensure that for negative integers the result does not get renormalized, thereby shifting the integer left from its desired location in the right-most bit of the significand. If fewer than b−2 bits are used in the subsequent integer operations, then the instructions in Table II are equivalent to those of Table I for computing $n_i$, $n_f$, and r.

In one embodiment of the invention the selection of S can be generalized if the desired result is to be m, where $m=n*2^k$. In this case, the exponent of the constant would be (b−k−1). In this embodiment, the selection of S is useful when the desired integer needs to be divided into sets of indices for a multi-table lookup. For example, n may be broken up such that $n=n_0*2^7+n_1*2^4+n_2$ to compute indices $n_1$ and $n_2$ for accessing 16-entry and 8-entry tables. With this embodiment, it is required that S be available at the same time as the constant A. In one embodiment of invention, the constant S can be loaded from memory or on a processor such as Intel's Itanium™, S is easily generated with the following instructions 1) movl of the 64-bit IEEE double precision bit pattern, followed by 2) setf.d to load S into a floating-point register.

In one embodiment of the invention, the constant may be of the form having a "1" followed by a decimal point, j−1 bits ("0"s or "1"s) to the immediate right of the decimal point, a "1" following the j−1 bits, then b−j−1 "0"s. Note that the previous discussed embodiment was of the form having j=1.

The following discussion relates to an embodiment of the invention incorporating the creation of constants needed to compute $n_i$, $n_f$, and r. Accuracy requirements of mathematical library algorithms typically require the multiplication, $w=x*A$, be performed in double-extended precision (64-bit space significand). Therefore, the constant A needs to be loaded with double-extended precision. This is typically performed by storing the constant statically in memory, then loading it into a floating-point register (e.g., the ldfe instruction on an Intel Itanium™ processor).

Due to the requirement that the library be position independent (i.e. sharable), loading is performed by an indirect load. For this indirect load, the address of the pointer to the constant is computed first, the pointer to the constant is then loaded, then the constant is loaded. For a processor, such as Intel's Itanium™, this sequence takes a minimum of 13 cycles. This sequence can take longer than 13 cycles if the pointer and constants are not available in cache memory.

On some processors, such as Intel's Itanium™, there is no method to directly load a double-extended constant without using memory instructions. There is a way, however, to directly load the significand of a floating-point constant by first forming a 64-bit significand in an integer register and then using an instruction (e.g., setf.sig on Intel's Itanium™) to put the significand into the floating-point register. Such an instruction sets the exponent to $2^{63}$. On a processor, such as the Intel Itanium™ processor, this sequence takes 10 cycles. In one embodiment of the invention, three cycles of latency can be saved by using a constant S, having the correct significand, but a modified exponent.

Figure 4:
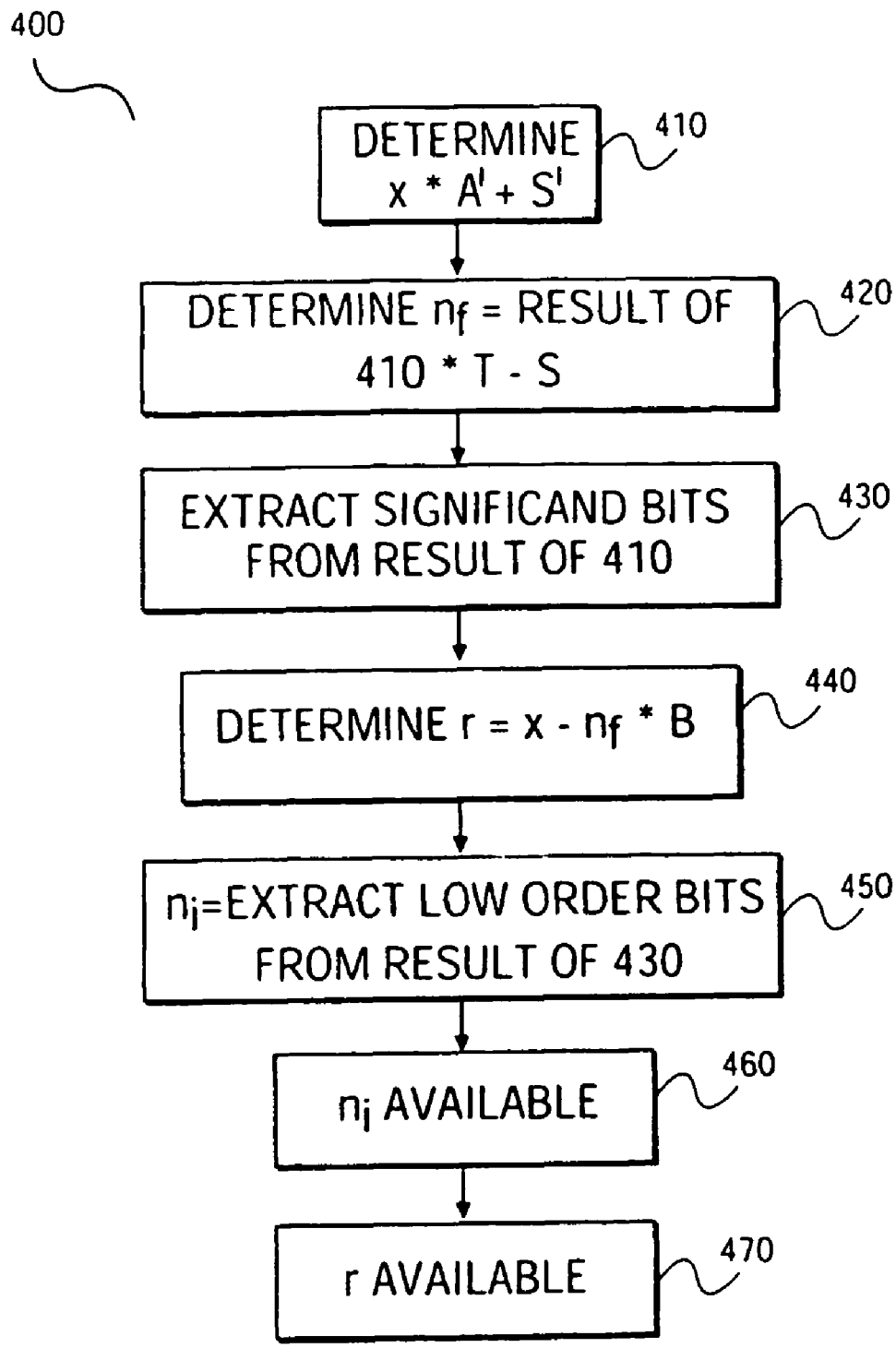
FIG. 4 illustrates an embodiment of the invention used to generalize selection of a constant S.

FIG. 4 illustrates an embodiment of the invention used to generalize selection of a constant S in determining $n_i$, $n_f$, and r. In process 400, block 410 computes the result of x*A'+S' (where S' is a scaled version of S, discussed further below). Block 420, using the result from block 410, multiplies the result from block 410 by T (T is a factor, where $T=2^{-(b-1-j)}$) and then subtracts S. Block 430 extracts the significand bits from the result from block 410, thus creating an integer value. Block 440 computes r by computing $x-n_f*B$. Block 450 extracts the low-order bits from the result of block 430. At block 460, $n_i$ is available to be transmitted to an ALU or stored in memory. In block 470, r is available to be transmitted to an ALU or stored in memory. In process 400, $A=2^j*F$, where F is the significand of the form 1.xxxxxxxx, $1.0 \leq |F| < 2.0$. Also, $A'=2^{b-1}*F$.

Table III illustrates pseudo-code steps for process 400 illustrated in FIG. 4.

TABLE III

| Falu op 1: | w_plus_S_rshifted = x * A' + S' | (1) |
|---|---|---|
| Falu op 2: | $n_f$ = w_plus_S_rshifted * T − S | (6) |
| Ialu op 1: | ni_plus_S = extract_ significand_bits (w_plus_S_shifted) | (9) |
| Falu op 3: | r = x − $n_f$* B | (11) |
| Ialu op 2: | $n_i$ = extract_low_order_ bits(ni_plus_S) | (11) |
| | $n_i$ available | (12) |
| | r available | (16) |

In one embodiment of the invention, for the shift to performed properly, a scaled version of S is needed, S', in Falu op 1, where $S'=S*2^{b-1-j}$. To get $n_f$ in Falu op 2, w_plus_S_rshifted is scaled back by a factor T, where $T=2^{-(b-1-j)}$. In this embodiment of the invention, four constants are generated, A', S', S, and T. In one embodiment of the invention, these four constants are determined in parallel.

Figure 5:
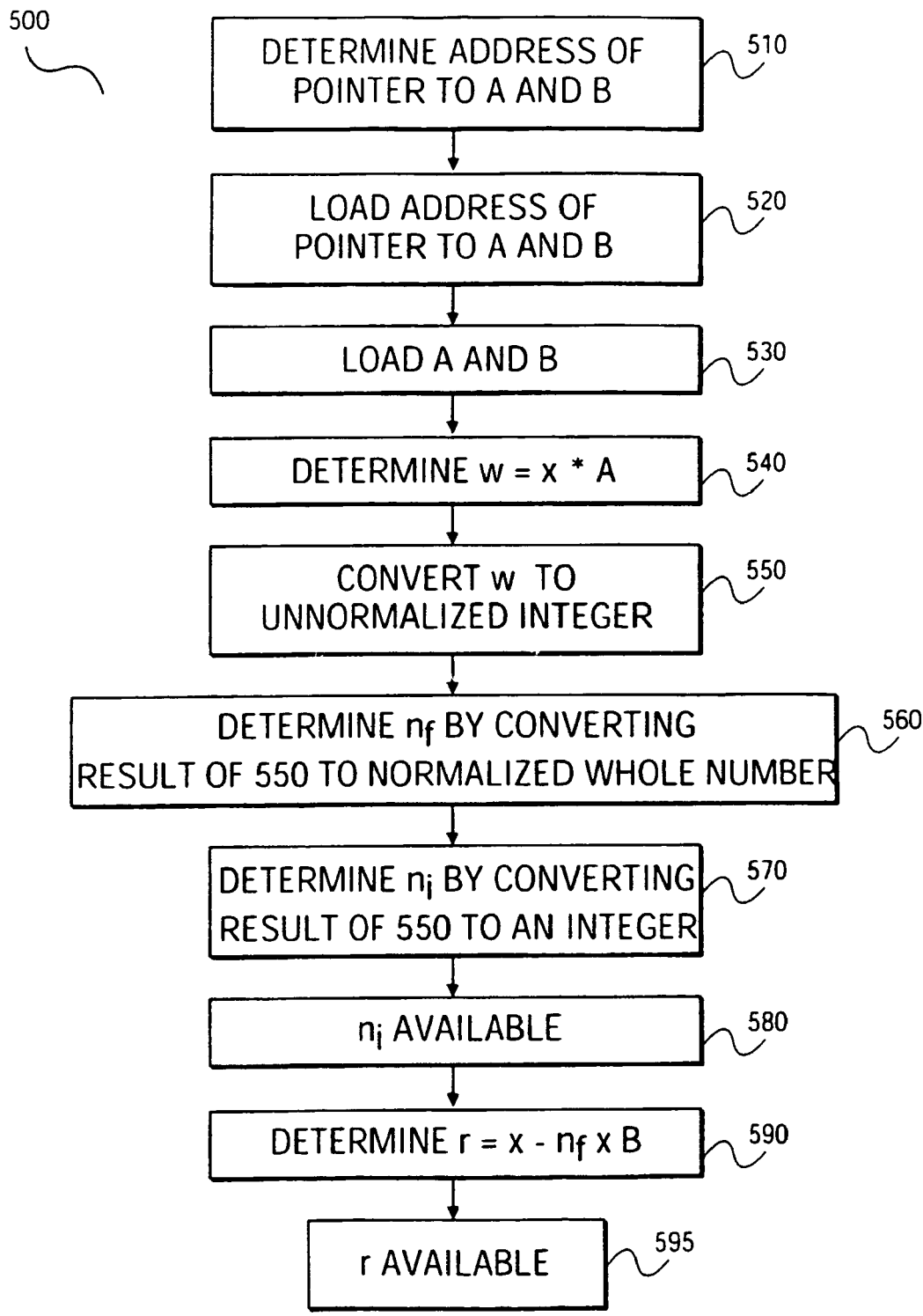
FIG. 5 illustrates a typical process for loading constants and calculating the necessary coefficients for decomposition of floating-point numbers into their integer and fractional parts.

FIG. 5 illustrates process 500, which is a typical process for loading constants and calculating coefficients for decomposition of floating-point numbers into their integer and fractional parts. On a typical processor, such as Intel's Itanium™, the entire sequence from loading constants through the computation of r, takes 36 cycles. Process 500 begins with block 510 which computes the address of a pointer to A and B. Block 520 loads the address of the pointer to A and B. Block 530 loads A and B. Block 540 computes the equation w=x*A. Block 550 converts the result from block 540 (w) to an unnormalized integer. Block 560 computes $n_f$ by converting the result of block 550 to a normalized whole number. Block 570 computes $n_i$ by converting the result of block 550 to an integer. In block 580, $n_i$ is available to be transmitted to an ALU or stored in memory. In block 590, r is computed by the equation $x-n_f*B$. In block 595, r is available to be transmitted to an ALU or stored in memory.

Table IV illustrates process 500 in pseudo-code. The numbers on the right hand side of Table IV represent typical cycles on a processor such as Intel's Itanium™.

TABLE IV

| Ialu op 1: | Compute address of pointer to A, B | (1) |
|---|---|---|
| Ialu op 2: | Load address of pointer to A, B | (2) |
| Ialu op 3: | Load A, B | (5) |
| Falu op 1: | w = x * A | (14) |
| Falu op 2: | w_rshifted = convert_to_unnormalized_ rounded_int(w) | (19) |
| Falu op 3: | $n_f$= convert_to_normalized_whole_ number(w_rshifted) | (26) |

TABLE IV-continued

| Ialu op 4; | $n_i$ = convert_to_integer(w_rshifted) | (27) |
|---|---|---|
| | $n_i$ available | (29) |
| Falu op 4: | r = x − $n_f$* B | (31) |
| | r available | (36) |

Figure 6A:
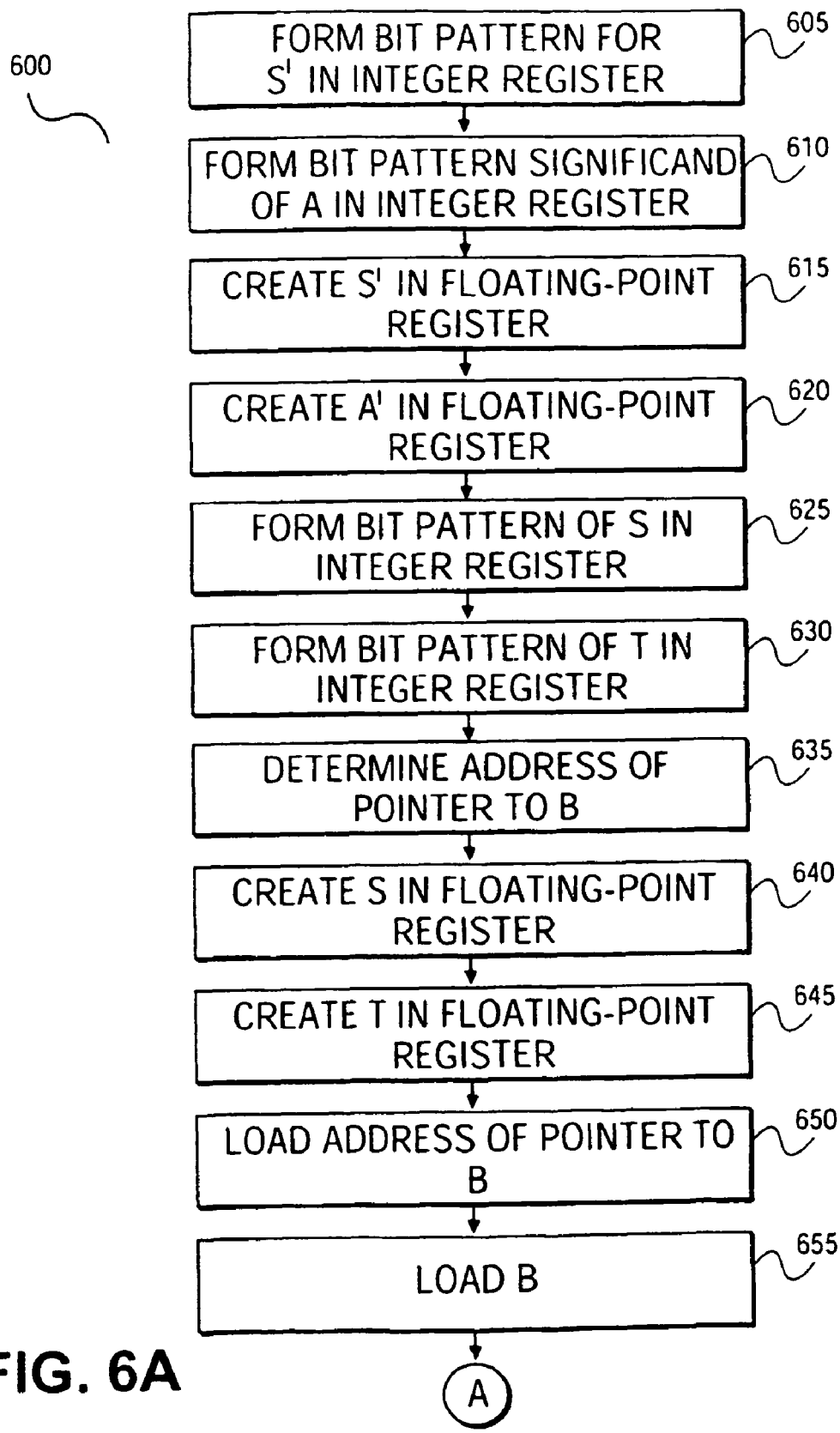
FIG. 6A-B illustrates an embodiment of the invention for loading of constants and performing decomposition of floating-point numbers into their integer and fractional parts.
Figure 6B:
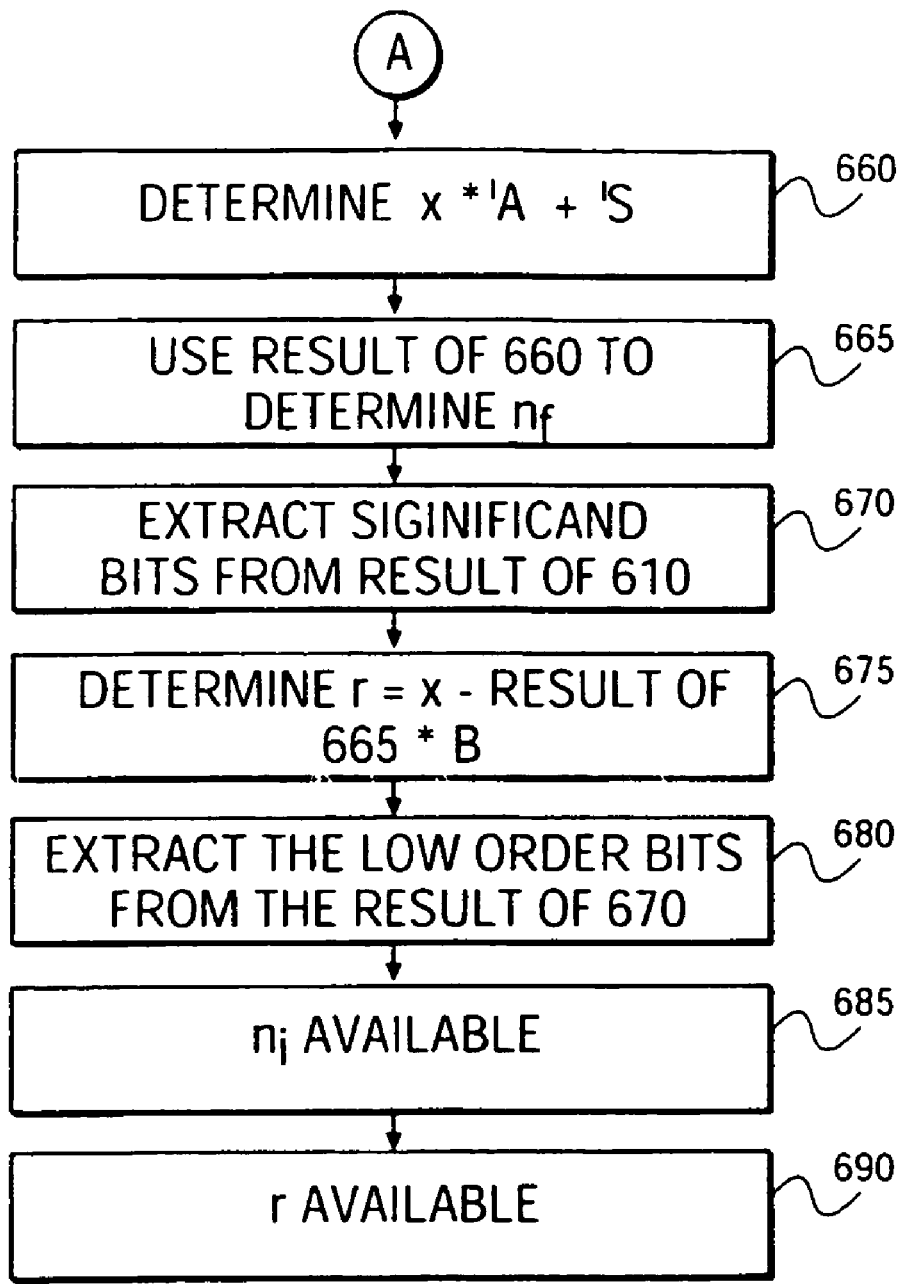

FIG. 6A-B illustrates an embodiment of the invention for loading of constants and performing decomposition of floating-point numbers into their integer and fractional parts. Process 600 begins with block 605 which forms a bit pattern of S' in an integer register. Block 610 forms a bit pattern of the significand of A in an integer register. Block 615 creates S' in a floating-point register. Block 620 creates A' in a floating-point register. Block 625 forms a bit pattern of S in an integer register. Block 630 forms a bit pattern of T in an integer register. Block 635 computes the address of a pointer to B. Block 640 creates S in a floating-point register. Block 645 creates T in a floating-point register. Block 650 loads the address of a pointer to B. Block 655 loads B. Block 660 computes x*A'+S'. In block 665, the result from block 660 is multiplied by T and then the value for S is subtracted. The result from block 665 represents $n_f$. In block 670, the significand bits are extracted from the result from block 660, thus creating an integer value. In block 675, r is computed by the equation $x-n_f*B$. In block 680, the result from block 670 is used to extract the low order of bits. The result of block 680 is $n_i$. In block 685, $n_i$ is available to be transmitted to an ALU or stored in memory. In block 690 r is available to be transmitted to an ALU or stored in memory.

Table V illustrates process 600 (see FIG. 6A-B) in pseudo-code format. Note that the numbers on the right of Table V enclosed in parentheses represent cycles for a processor, such as Intel's Itanium™. In one embodiment of the invention, process 300 and process 600 are loaded into mathematical libraries used by various compilers. In another embodiment of the invention, the same processes loaded into a mathematical library can be used for processing functions, such as scalar double precision tangent, sine, cosine, exponential functions, hyperbolic cosine, hyperbolic sine, hyperbolic tangent, etc. to reduce the number of cycles necessary to complete operations as compared to prior art. It should be noted that other embodiments of the invention can be used for processing functions such as scalar single precision, vector double precision, and vector single precision.

TABLE V

| Ialu op 1: | Form bit pattern of S' in integer reg (movl) | (1) |
|---|---|---|
| Ialu op 2: | Form bit pattern significand of A in integer reg(movl) | (1) |
| Ialu op 3: | Create S' in fp reg (setf.d) | (2) |
| Ialu op 4: | Create A' in fp reg (setf.sig) | (2) |
| Ialu op 5: | Form bit pattern of S in integer reg (movl) | (2) |
| Ialu op 6: | Form bit pattern of T in integer reg (movl) | (2) |
| Ialu op 7: | Compute address of pointer to B | (3) |
| Ialu op 8: | Create S in fp reg (setf.d) | (4) |
| Ialu op 9: | Create T in fp reg (setf.d) | (4) |
| Ialu op 10: | Load address of pointer to B | (5) |
| Ialu op 11: | Load B | (8) |
| Falu op 1: | w_plus_S_rshifted = x * A' + S' | (11) |
| Falu op 2: | $n_f$= w_plus_S_rshifted * T − S | (16) |
| Ialu op 12: | ni_plus_S = extract_significand_bits (w_plus_S_rshifted) | (19) |
| Falu op 3: | r = x − $n_f$* B | (21) |
| Ialu op 13: | $n_i$ = extract_low_order_bits(ni_plus_S) | (21) |
| | $n_i$ available | (22) |
| | r available | (26) |

Figure 7:
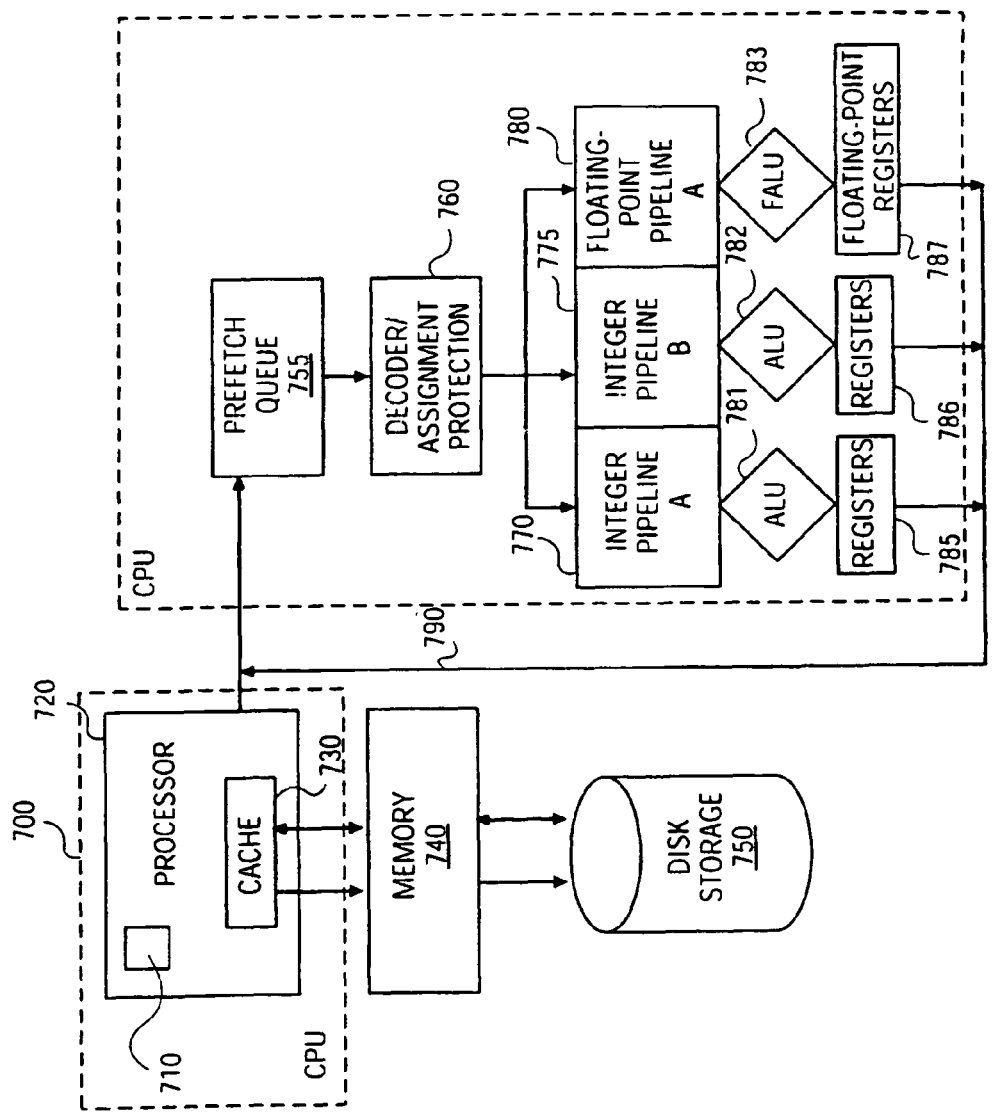
FIG. 7 illustrates an embodiment of the invention having a computational component.

FIG. 7 illustrates an embodiment of the invention having computational component 710. Circuit 700 also comprises microprocessor 720, cache 730, memory 740, disk storage 750, pre-fetch queue 755, decode/assignment/predictor 760, integer pipeline A 770, integer pipeline B 775, floating-point pipeline A 780, ALU 781-782, floating point ALU 783, integer register sets 785-786, floating point register set 787, and data bus 790. In one embodiment of the invention, computational component 710 incorporates process 300, 400 or 600 illustrated in FIGS. 3, 4, and 6A-B, respectively.

The above embodiments of the invention can be used whenever integer and fractional components of a floating-point number are necessary to perform argument reduction portions of scalar and vector double precision functions, scalar and vector single precision functions, various mathematical functions, and preprocessing before computing mathematical functions. By using the above discussed embodiments of the invention, computational latency is reduced without compromising precision.

The above embodiments can also be stored on a device or machine-readable medium and be read by a machine to perform instructions. The machine-readable medium includes any mechanism that provides (i.e., stores and/or transmits) information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.). The device or machine-readable medium may include a solid state memory device and/or a rotating magnetic or optical disk. The device or machine-readable medium may be distributed when partitions of instructions have been separated into different machines, such as across an interconnection of computers.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method comprising:
    loading a first value into a computer processor, the first value being a floating point number, the computer processor including a plurality of arithmetic logical units (ALUs) including one or more floating point arithmetic logical units (FALUs), wherein a floating point number comprises a sign bit, a first plurality of exponent bits, and a second plurality of significand bits and wherein an integer comprises a plurality of bits, the first value being represented by a value x times a constant A;
    decomposing the first value into integer and fractional parts, the decomposing of the first value comprising:
        shifting a rounded integer portion of the first value to generate a second value in a first floating point ALU operation, where the shifting provides an addition of a constant S value to the first value, wherein the rounded integer portion is shifted into rightmost bits of the significand of the first value,
        generating a third value $n_f$ from the second value in a second floating point ALU operation, the third value generated by subtracting the constant S from the second value to generate an integer,
        extracting a plurality of significand bits from the second value to generate a fourth value in a first integer ALU operation,
        generating a fifth value r from the third value in a third floating point ALU operation, the fifth value being generated by subtracting the third value times a constant B from x, where B=1/A, and
        extracting a portion of bits from the fourth value to generate an integer component in a second integer ALU operation;
    wherein the transformed representation of the first value represented by the third value, the fifth value, and the integer component are stored in a memory or transmitted to an ALU.

2. The method of claim 1, further comprising: generating the constant S.

3. The method of claim 2, wherein generating the constant S includes generating a constant so that adding the constant S to the first value shifts the rounded integer portion into the rightmost bits of the significand of the first value.

4. An apparatus comprising a non-transitory machine-readable storage medium containing instructions which, when executed by a machine, cause the machine to perform operations comprising:
    loading a first value into a computer processor, the first value being a floating point number, the computer processor including a plurality of arithmetic logical units (ALUs) including one or more floating point arithmetic logical units (FALUs), wherein a floating point number comprises a sign bit, a first plurality of exponent bits, and a second plurality of significand bits and wherein an integer comprises a plurality of bits, the first value being represented by a value x times a constant A;
    decomposing the first value into integer and fractional of parts, the instructions that cause the machine to perform decomposing operations further includes operations including:
        generating a first constant S;
        shifting a rounded integer portion of the first value to generate a second value in a first FALU operation, where the shifting provides an addition of the constant S value to the first value, wherein the rounded integer portion is shifted into rightmost bits of the significand of the first value,
        generating a third value $n_f$ from the second value in a second FALU operation, the third value generated by subtracting the constant S from the second value to generate an integer,
        extracting a plurality of significand bits from the second value to generate a fourth value in a first IALU operation,
        generating a fifth value r from the third value in a third FALU operation, the fifth value being generated by subtracting the third value times a constant B from x, where B=1/A, and
        extracting a portion of bits from the fourth value to generate an integer component in a second IALU operation;
    wherein the transformed representation of the first value represented by the third value, the fifth value, and the integer component are stored in a memory or transmitted to an ALU.

5. An apparatus comprising:
    a processor, the processor having a computational component;
    a bus coupled to the processor; a memory coupled to the processor;
    a plurality of arithmetic logical units (ALUs) coupled to the processor including one or more floating point ALUs (FALUs); and a plurality of register sets coupled to the plurality of ALUs;
wherein the computational component is operable to:
load a first value into a computer processor, the first value being a floating point number,
wherein a floating point number comprises a sign bit, a first plurality of exponent bits, and a second plurality of significand bits and wherein an integer comprises a plurality of bits, the first value being represented by a value x times a constant A; and
decompose the first value into integer and fractional parts, the decomposing of the first value comprising:
  shifting a rounded integer portion of the first value to generate a second value in a first floating point ALU operation, where the shifting provides an addition of a constant S value to the first value, wherein the rounded integer portion is shifted into rightmost bits of the significand of the first value,
  generating a third value $n_r$ from the second value in a second floating point ALU operation, the third value generated by subtracting the constant S from the second value to generate an integer,
  extracting a plurality of significand bits from the second value to generate a fourth value in a first integer ALU operation,
  generating a fifth value r from the third value in a third floating point ALU operation, the fifth value being generated by subtracting the third value times a constant B from x, where B=1/A, and
  extracting a portion of bits from the fourth value to generate an integer component in a second integer ALU operation;
wherein the transformed representation of the first value represented by the third value, the fifth value, and the integer component are stored in a memory or transmitted to an ALU.

6. The apparatus of claim 5, wherein the constant S is generated such that adding the constant S to the first value shifts the rounded integer portion into the rightmost bits of the significand of the first value.

7. The apparatus of claim 4, wherein generating the constant S comprises generating a constant such that when added to the first value produces a shift of the rounded integer portion into the rightmost bits of the significand of the first value.

* * * * *

UNITED STATES PATENT AND TRADEMARK OFFICE
CERTIFICATE OF CORRECTION

PATENT NO. : 8,185,723 B2
APPLICATION NO. : 10/483279
DATED : May 22, 2012
INVENTOR(S) : Norin et al.

It is certified that error appears in the above-identified patent and that said Letters Patent is hereby corrected as shown below:

In the Specification

In column 2, at line 57 delete, "(Iglu)" and insert -- (Ialu) --.

In column 4, at line 32 delete, "decimal point" and insert -- binary point --.

In column 4, at line 33 delete, "decimal point" and insert -- binary point --.

In column 4, at line 35 delete, "previous" and insert -- previously --.

In column 5, at line 12 delete, "$1.0 \leqq |F| < 2.0$" and insert -- $1.0 \leq |F| < 2.0$ --.

Signed and Sealed this
Fifteenth Day of April, 2014

Michelle K. Lee
*Deputy Director of the United States Patent and Trademark Office*